United States Patent [19]

Pijnenburg et al.

[11] Patent Number: 5,121,073
[45] Date of Patent: Jun. 9, 1992

[54] FM DEMODULATOR ARRANGEMENT INCLUDING HOLD, DELAY AND SWITCHING CIRCUITS TO COMPENSATE FOR SIGNAL DISTURBANCES

[75] Inventors: Josephus A. Pijnenburg; Willem H. Noordermeer; Gerrit J. Groot Hulze, all of Eindhoven, Netherlands

[73] Assignee: U.S. Philips Corporation, New York, N.Y.

[21] Appl. No.: 755,929

[22] Filed: Sep. 6, 1991

[30] Foreign Application Priority Data

Sep. 12, 1990 [NL] Netherlands ............... 9002004

[51] Int. Cl.$^5$ ............... H03D 3/00; G11B 20/06
[52] U.S. Cl. ............... 329/318; 360/30; 360/64; 455/312; 358/330
[58] Field of Search ............... 329/318; 360/30, 64; 455/312; 358/330

[56] References Cited

U.S. PATENT DOCUMENTS 4,403,262 9/1983 Ito et al. ............... 360/30 X
4,870,511 9/1989 Pijnenburg et al. ............... 360/30

Primary Examiner—Siegfried H. Grimm
Attorney, Agent, or Firm—Edward W. Goodman

[57] ABSTRACT

In order to reduce the disturbances caused by the head switch in a videotape recorder, in an arrangement for demodulating an FM modulated signal, a fixed value in the hold circuit used for maintaining the fixed value for the signal during the head switch, is selected such that it is situated at a value the interpolated signal would have had during the head switch time interval ($T_1$) at an instant situated between 0.3 $T_1$ and 0.8 $T_1$ in the head switch interval. This may be realized with a delay unit which realizes a delay $T_v$ for which holds: 0.3 $T_1 < T_v < 0.8\ T_1$.

7 Claims, 2 Drawing Sheets

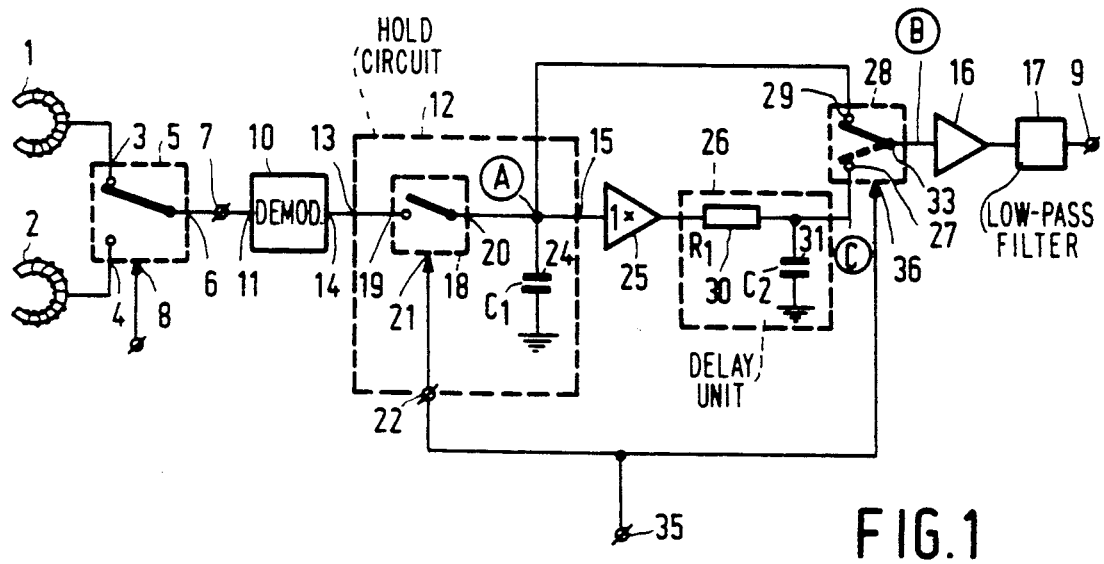
FIG.1
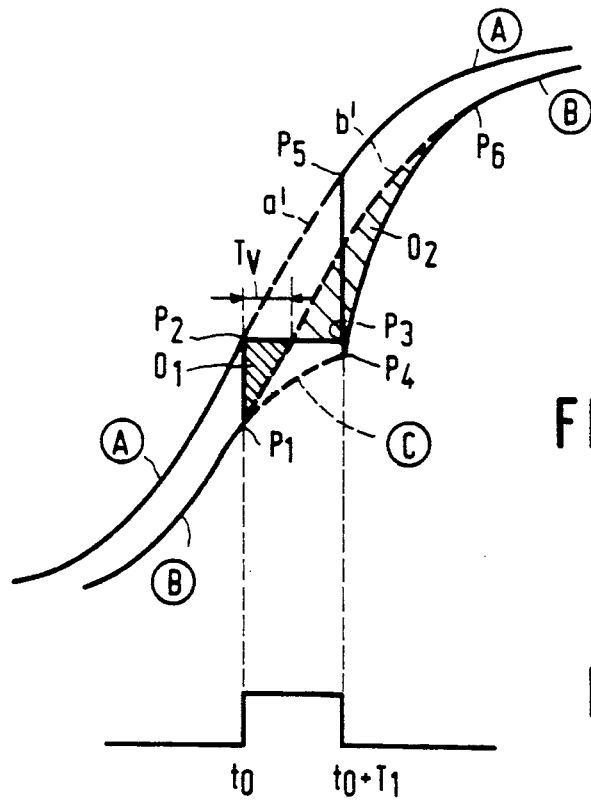
FIG. 2a
FIG. 2b

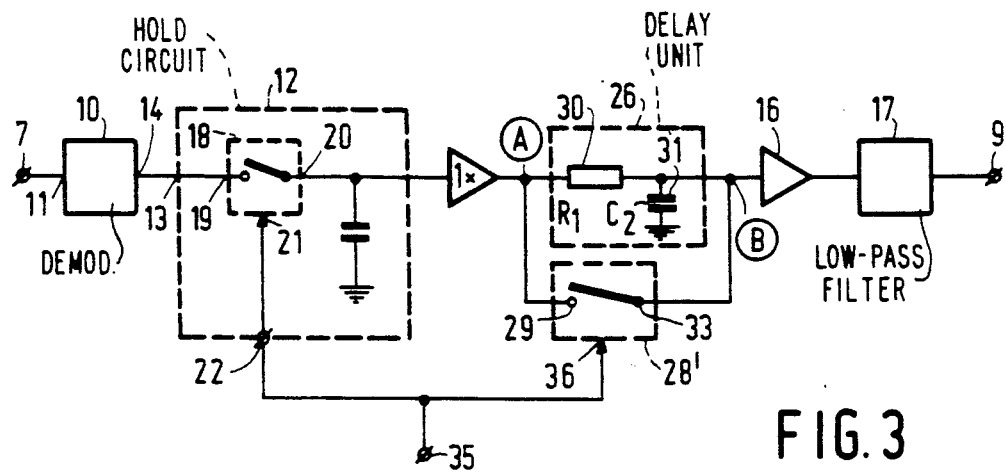
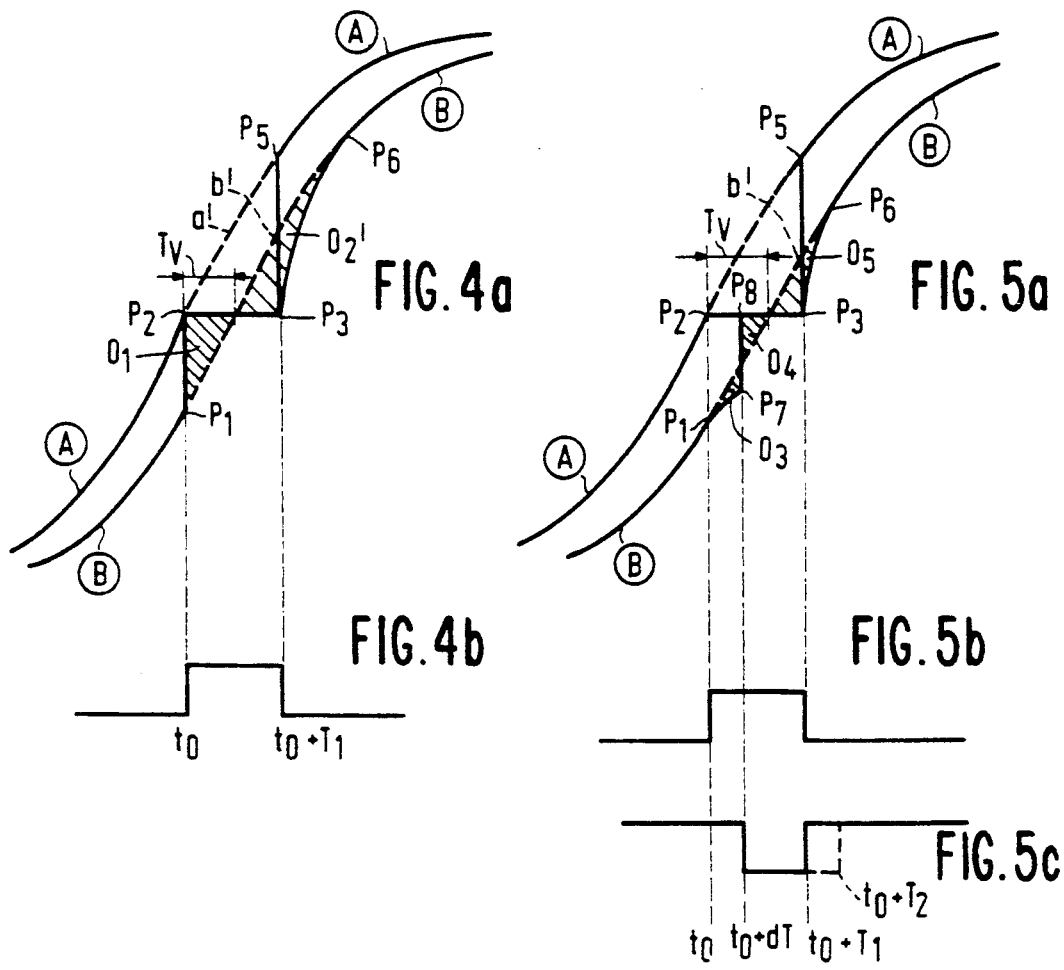

FM DEMODULATOR ARRANGEMENT INCLUDING HOLD, DELAY AND SWITCHING CIRCUITS TO COMPENSATE FOR SIGNAL DISTURBANCES

BACKGROUND OF THE INVENTION

1. Field of the Invention

The invention relates to an arrangement for demodulating an FM modulated signal, comprising an input terminal for receiving the FM modulated signal and an output terminal for supplying a demodulated signal, having a signal path between the input and output terminals, constituted by:
- a demodulator circuit for demodulating the FM modulated signal, having an input coupled to the input terminal, and an output,
- a hold circuit, having a signal input coupled to the output of the demodulator circuit, a control signal input and an output which is coupled to the output terminal, this hold circuit at least comprising a first controllable switching means, having an input and an output coupled to the input or output, respectively, of the hold circuit, and a control input coupled to the control signal input of the hold circuit, and a capacitor inserted between the output of the hold circuit and a first point of constant potential, the hold circuit being devised for at least substantially holding the signal applied to its input in response to a control signal applied to the control signal input and the first switching means being devised for interrupting for a first time interval $T_1$ the internal connection between the switch input and output in response to this control signal.

Such an arrangement may be included in, for example, a videotape recorder for demodulating an audio signal recorded FM modulated in the tracks on a record carrier once the record carrier has been read out, which arrangement further includes for this purpose:
- two or more read heads disposed on a rotatable head drum,
- a switching means having two or more inputs, an output and a control input, which switching means is further arranged for coupling one of the inputs to the output in response to a control signal to be applied to the control input, an output of each of the two or more read heads being coupled to an associated input of the two or more inputs of the switching means, and the output of the switching means being coupled to the input of the demodulator circuit.

The arrangement is intended for obviating instantaneous disturbances in the input signal of the demodulator circuit. Instantaneous disturbances are the disturbances affecting the regularity in the input signal. In this context they may be, for example, drop-outs or drop-ins in the input signal of the demodulator circuit, or phase jumps in this input signal which occur as a result of the switching from record carrier reading with one read head to record carrier reading with another read head (so-called head switch). These instantaneous disturbances cause the demodulator circuit to be deranged so that (audible) disturbances occur in the signal demodulated by the demodulator circuit.

2. Description of the Related Art

The low-pass filter inserted directly after the demodulator circuit in the prior art arrangement has for its object to eliminate by filtering the disturbing signal components such as intermodulation products, carrier residuals and noise beyond the audio band, which are formed in the demodulation circuit. A typical value for the cut-off frequency of such filter is, for example, 100 to 150 kHz. The drawback of this low-pass filter is the fact that the disturbances at the output of the demodulator circuit are extended to larger lengths with time. For example, disturbances that result from a head switch and which may have a length of about 4.5 μs, are extended to a length of about 8 to 10 μs by a low-pass filter having a cut-off frequency of the order of 100 kHz. This implies that the first switching means is (to be) open during the time interval $T_1$, which is approximately equal to these 8 to 10 μs. The purely periodical nature of the energizing of the hold circuit (with attendant opening of the switching means) with the frequency of the head switch, in combination with the great length of the time interval $T_1$, causes a disturbing contribution to occur in the output signal of the arrangement.

SUMMARY OF THE INVENTION

It is an object of the invention to devise an arrangement that provides a much lower disturbance component in the signal at the output terminal.

Thereto, the arrangement according to the invention is characterized in that the arrangement further includes a delay unit having an input coupled to the output of the hold circuit and having an output, and includes a second controllable switching means with at least a first terminal coupled to the output of the hold circuit, a second terminal coupled to the output terminal of the arrangement and a control signal input for receiving a control signal, in that the delay unit is arranged for delaying the signal applied to its input by a delay $T_v$, for which holds: $0.3\ T_1 < T_v < 0.8\ T_1$, and in that the second controllable switching means is arranged for connecting the first terminal to the second terminal during the last part of the first time interval in response to the control signal applied to the control signal input.

The invention is based on the recognition that the omission of the low-pass filter enables a much shorter hold time (time interval $T_1$).

In European Patent Application No. 272.726 (PHN 11.953), corresponding to U.S. Pat. No. 4,870,511, there is proposed to include the capacitive element of the low-pass filter in the hold circuit. More specifically, drawing FIG. 7 of that application shows a circuit which very much resembles the arrangement according to this invention. The RC network shown therein and formed by the resistor $R_1$ and the capacitor $C_1$ realizes a delay, it is true. But this delay is not specified as is proposed in the present application. The prior art arrangement also presents a second switching means. This second switching means, however, has different configurations and realizes an internal connection between the first and second terminals just outside the time interval $T_1$.

The invention is actually based on the concept that it would be better to take a hold level the signal would have about halfway the head switch interval assuming that this would not be disturbed by the head switch, rather than a hold level that corresponds to the signal level of the signal to be held at the beginning of the head switch time interval $T_1$. The differences relative to the signal are then smaller, which produces a smaller distortion.

BRIEF DESCRIPTION OF THE DRAWINGS

The invention will be further described with the aid of a number of embodiments given with reference to the following drawing Figures. Elements having like reference characters in the various drawings are the same. In this description:

FIG. 1 shows a first embodiment of an FM demodulating arrangement;

FIGS. 2a and 2b show a number of signals present at a number of points in the circuit shown in FIG. 1 plotted against time;

FIG. 3 shows a second embodiment of an FM demodulating arrangement;

FIGS. 4a and 4b show a number of signals present at a number of points in the circuit shown in FIG. 3 plotted against time; and FIGS. 5a, 5b and 5c show a number of signals present at a number of points in the circuit shown in FIG. 3 plotted against time.

DESCRIPTION OF THE PREFERRED EMBODIMENTS

FIG. 1 shows an embodiment of the arrangement applied to a videotape recorder. A number of read heads 1 and 2 (in this case two) installed on a rotatable head drum (not shown) are coupled to inputs 3 and 4, respectively, of a switching means 5. The output 6 of the switching means 5 is coupled to the input terminal 7 of the arrangement. The switching means 5 is arranged for coupling one of the inputs 3, 4 to the output 6 in response to a control signal to be applied to a control input 8. This control signal may be supplied by a control unit (not shown) which is capable of deriving this control signal from an internal clock signal in the control unit, which clock signal can be synchronized in one way or another with the signal read out from a magnetic record carrier (not shown) by the read heads.

The input terminal 7 of the arrangement, to which the FM modulated signal read out from the magnetic record carrier is applied, is coupled to an output terminal 9 over a signal path. The signal path in FIG. 1 is constituted by a demodulator circuit 10 whose input 11 is coupled to the input terminal 7, and a hold circuit 12 having a control signal input 22, an input 13 coupled to the output 14 of the demodulator circuit 10, and an output 15. The output 15 is coupled through a buffer amplifier 25 which realizes a 1× gain, and a delay unit 26 which realizes a delay by a time interval $T_\nu$, which delay unit is coupled to a terminal 27 of a switching means 28. The output 15 is also directly coupled to a terminal 29 of the switching means 28. The delay unit 26 is constituted by a resistor 30 inserted between the input and output of the delay unit 26, and a capacitor 31 inserted between the output of the delay unit 26 and a point of constant potential (ground). The impedances $R_1$ and $C_2$ of the resistor 30 and capacitor 31, respectively, are selected in such a way that the delay unit 26 realizes a delay $T_\nu$ of the signal supplied to its input, for which holds: $0.3 T_1 < T_\nu < 0.8 T_1$. $T_\nu$ is preferably taken to be equal to $0.5 T_1$ or somewhat larger, for example $0.6 T_1$ or $0.7 T_1$.

A terminal 33 of the switching means 28 is coupled to low-pass filter 17 by means of a buffer amplifier 16 which provides that the circuit inserted in the signal path after the buffer amplifier 16 does not form a load for the hold capacitor 24. This low-pass filter 17 avoids disturbing components situated outside the audio range reaching the next circuits. The output of the low-pass filter 17 is coupled to the output terminal 9.

The hold circuit 12 comprises a first controllable switching means 18, which has an input 19 and an output 20 coupled to the input 13 or output 15 respectively, of the hold circuit. The switching means 18 further has a control input 21 coupled to the control signal input 22. The output 20 of the controllable switching means 18 is coupled to an output 15 of the hold circuit 12. The output 15 is further coupled to a point of constant potential (ground) across a hold capacitor 24.

In prior art arrangements for demodulating an FM modulated signal, a low-pass filter is inserted between the output 14 of the demodulator circuit 10 and the input 13 of the hold circuit 12. This inserted low-pass filter has a drop-out frequency of about 100 to 150 kHz and is intended to filter out disturbing signal components such as intermodulation products, carrier remainders and noise beyond the audio range.

The disadvantage of this low-pass filter is that the disturbances in the output signal of the demodulator circuit 10, caused by the switching in the switching means 5 from reading with one read head, for example read head 1 to reading with the other read head, in that case read head 2 are extended with time. The switching means 18 is thus to be open for a relatively long time. The drop-out frequency of 100 to 150 kHz of the low-pass filter be selected to be (much) lower because this would entail a spreading out of the disturbances over a much longer period of time.

By omitting the low-pass filter, the switching means 18 needs to be open for a shorter time interval too (the time interval $T_1$, cf. FIG. 2b), which thus means a smaller disturbance in the output signal at the output terminal 9. $T_1$ is thus shortened from about 8 to 10 μs to 4 to 5 μs as was observed hereinbefore.

The operation of the circuit shown in FIG. 1 will be further explained with reference to FIGS. 2a and 2b.

FIG. 2b shows the control signal applied to a terminal 35 of the arrangement shown in FIG. 1. Prior to the instant $t_0$, this control signal is "low". This implies that the switching means 18 has adopted the closed state and the switching means 28 the state in which terminal 27 is connected to terminal 33. The control signal is applied through the input 35 both to the control signal input 22 of the hold circuit and to the control signal input 36 of the switching means 28. During the head switch interval $T_1$ (between $t = t_0$ and $t = t_0 + T_1$) the control signal is "high". The switching means 18 now has adopted the open state and the switching means 28 a state in which the terminal 29 is connected to the terminal 33. After the instant $t = t_0 + T_1$ the control signal is "low" again, so that the switching means 18 is closed again and the switching means 28 has adopted the state in which terminal 27 is connected to the terminal 33.

FIG. 2a shows two signals A and B plotted against time and present at the points A and B in FIG. 1. Due to the delay $T_\nu$ caused by the delay unit 26, the signal at point B trails the signal at point A.

The signal at point A is represented by the curves through the points $P_2$, $P_3$ and $P_5$ for the time interval from $t = t_0$ to $t = t_0 + T_1$. The signal at point B for the same time interval is represented by the curves through the points $P_1$, $P_2$, $P_3$, $P_4$ and $P_6$. At the instant $t = t_0$, the switching means 28 moves to the state as represented in FIG. 1. The signal B then equals the signal of curve A. This is shown in FIG. 2a by means of the line $P_1 - P_2$. At the instant $t = t_0 + T_1$ the switching means 28 moves to the other state. The signal B then equals the signal of curve C. The course of the signal of curve C during the time interval ($t_0$, $t_0+T_1$) is represented in FIG. 2a by means of the dashed curve C. This change from the signal A to the signal C at the instant $t_0+T_1$ is represented by means of the curve $P_3-P_4$. Subsequently, the signal at point B again slowly approaches the desired curve. This is represented by the curve between the points $P_4$ and $P_6$. The distortion of curve A is thus represented by the deviation from the real signal curve through the points $P_2$, $P_3$ and $P_5$ and the interpolated curve a' shown in FIG. 2a. The distortion for the curve B is represented by the hatched areas $0_1$ and $0_2$ representing the deviation of the real curve B from to the interpolated curve b'. The distortion in the curve B is situated symmetrically around the interpolated curve b' and is thus less disturbing than the distortion of curve A.

FIG. 3 shows a second embodiment in which the switching means 28 has a different configuration and is therefore referenced 28'. Again the same control signals are applied to the two switching means 18 and 28'. This control signal is also represented in FIG. 4b. In response to the "low" control signal for the instants prior to $t=t_0$ and subsequent to $t=t_0+T_1$ the switching means 18 is again closed. The switching means 28' has now adopted the open state as is shown in FIG. 3. In the time interval between $t=t_0$ and $t=t_0+T_1$ the control signal is "high". The switching means 18 is now open and switching means 28' closed. The terminals 29 and 33 are interconnected.

The signal at point A in FIG. 3 is represented by the curve A in FIG. 4a. This curve is the same as the curve a in FIG. 2a.

The signal at point B in FIG. 3 is represented by the curve B in FIG. 4a, which curve varies through the points $P_1$, $P_2$, $P_3$ and $P_6$ during the time interval ($t_0$, $t_0+T_1$). An improvement relative to the curve B in FIG. 2a is achieved in that the reduction of the signal at the instant $t_0+T_1$ from $P_3$ to $P_4$ does not occur. The area $0_2'$ is thus smaller than the area $0_2$ in FIG. 2a so that the distortion in the curve B in FIG. 4a is smaller.

FIG. 5a shows the signals at points A and B in the circuit of FIG. 3 when the switching means 28' is driven in a different manner. FIG. 5b again shows the control signal for the switching means 18. The switching means 28' now receives another control signal, i.e. the control signal indicated in FIG. 5c. This implies that a converter unit (not shown) is to be inserted into the connection from the terminal 35 to the control signal input 36 of the switching means 28' which unit provides that, on the basis of the control signal of FIG. 5b, a control signal according to FIG. 5c is generated. With a "high" control signal for instants prior $t=t_0+dT$ and subsequent to $t=t_0+T_1$ the switching means 28' is open. In the time interval ($T_0+dT$, $t_0+T$) the control signal is "low" and the switching means 28' is closed.

The signal at point A is unchanged, cf. FIG. 5a. The signal at point B is now represented by the curve B while in the time interval ($t_0$, $t_0+T_1$) the signal passes through the points $P_1$, $P_7$, $P_8$, $P_3$ and $P_6$.

In the time interval ($t_0$, $t_0+dT$), the switching means 18 is open while the switching means 28' is also open. The signal at point B then shows a behavior in accordance with the curve $P_1$, $P_7$. At the instant $t=t_0+dT$, the switching means 28' closes so that the signal at point B assumes the value of the signal at point A, cf. the curve $P_4$, $P_8$ in FIG. 5a. At the instant $t=t_0+T_1$, the switching means 28' is opened again so that the signal B shows a behavior according to the curve $P_3$. $P_6$.

$T_v$ is preferably taken somewhat greater than 0.5 $T_1$. In that case a better symmetry of the curve B around the interpolated b' is obtained. The distortions, represented by the areas $0_3$, $0_4$ and $0_5$ are now smaller than in the example shown with respect to FIG. 3.

The embodiment of FIG. 3 may be further changed by inserting a resistor having a certain resistance R into the line from the terminal 33 of the switch 28' to point B. The resistance R may be selected such that the slope of the curve B in FIG. 5a between the points $P_3$ and $P_6$ shows a certain angle. With this option for the value R it may be substantially achieved that for the areas $0_3$, $0_4$ and $0_5$ the following holds: $0_3+0_5=0_4$.

Preferably, the switch 28' is then kept closed for a longer period of time than till the instant $t_0+T_1$, that is to say, till the instant $t_0+T_2$ corresponding to the point $P_6$ in the curve B, cf. FIG. 5c.

It should be observed that the invention is not restricted only to the embodiments shown. The invention likewise applies to the arrangements differing from the shown embodiments at points not related to the embodiment.

We claim:

1. Arrangement for demodulating an FM modulated signal, comprising an input terminal for receiving the FM modulated signal and an output terminal for supplying a demodulated signal, having a signal path between the input and output terminals, constituted by:
   a demodulator circuit for demodulating the FM modulated signal, having an input coupled to the input terminal, and an output,
   a hold circuit, having a signal input coupled to the output of the demodulator circuit, a control signal input and an output which is coupled to the output terminal, this hold circuit at least comprising a first controllable switching means, having an input and an output coupled to the input or output respectively of the hold circuit, and a control input coupled to the control signal input of the hold circuit, and a capacitor inserted between the output of the hold circuit and a first point of constant potential, the hold circuit being devised for at least substantially holding the signal applied to its input in response to a control signal applied to the control signal input and the first switching means being devised for interrupting for a first time interval $T_1$ the internal connection between the switch input and output in response to this control signal, characterized in that
   the arrangement further includes a delay unit having an input coupled to the output of the hold circuit and having an output, and includes a second controllable switching means with at least a first terminal coupled to the output of the hold circuit, a second terminal coupled to the output terminal of the arrangement and a control signal input for receiving a control signal, in that the delay unit is arranged for delaying the signal applied to its input by a delay $T_v$, for which holds:
   0.3 $T_1 < T_v < 0.8$ $T_1$, and in that the second controllable switching means is arranged for connecting the first terminal to the second terminal during the last part of the first time interval in response to the control signal applied to the control signal input.

2. Arrangement as claimed in claim 1, characterized in that the second controllable switching means is arranged for connecting during the first time interval the first terminal to the second terminal in response to the control signal applied to the control signal input.

3. Arrangement as claimed in claim 1, characterized in that the second controllable switching means comprises a third terminal coupled to the output of the delay unit and in that the second controllable switching means is arranged for connecting the third terminal to the second terminal outside the first time interval.

4. Arrangement as claimed in claim 1, characterized in that the second terminal of the second controllable switching means is also coupled to the output of the delay unit and in that the second controllable switching means is arranged for interrupting the connection between the first and second terminals outside the first time interval.

5. Arrangement as claimed in claim 1, characterized in that $T_v$ is substantially equal to $0.5\ T_1$.

6. Arrangement as claimed in claim 1, characterized in that the delay unit comprises a resistor and a capacitor, in that the resistor is inserted between the input and output of the delay unit and in that the capacitor is inserted between the output of the delay unit and a point of constant potential.

7. Arrangement as claimed in claim 1, characterized in that the arrangement is included in a videotape recorder for demodulating a (an audio) signal recorded FM modulated on a record carrier once the record carrier has been read out, which arrangement further includes for this purpose:

two or more read heads disposed on a rotatable head drum, a switching means having two or more inputs, an output and a control input, which switching means is further arranged for coupling one of the inputs to the output in response to a control signal to be applied to the control input, an output of each of the two or more read heads being coupled to an associated input of the two or more inputs of the switching means, and the output of the switching means being coupled to the input of the demodulator circuit.

* * * * *